(12) United States Patent
Lee

(10) Patent No.: US 7,452,779 B2
(45) Date of Patent: Nov. 18, 2008

(54) SEMICONDUCTOR DEVICES HAVING IMPROVED GATE INSULATING LAYERS AND RELATED METHODS OF FABRICATING SUCH DEVICES

(75) Inventor: Chang-Hyun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 84 days.

(21) Appl. No.: 11/560,902

(22) Filed: Nov. 17, 2006

(65) Prior Publication Data

US 2007/0077703 A1 Apr. 5, 2007

(51) Int. Cl.
*H01L 21/336* (2006.01)
*H01L 27/108* (2006.01)

(52) U.S. Cl. ...................... 438/295; 257/296

(58) Field of Classification Search ............... 257/296, 257/300, 316, 337, 600; 438/157, 258, 283, 438/295
See application file for complete search history.

(56) References Cited

U.S. PATENT DOCUMENTS 6,165,846 A  12/2000 Carns et al. ............... 438/264
6,331,724 B1 * 12/2001 Chen et al. ................. 257/365
2005/0088889 A1 * 4/2005 Lee et al. .................... 365/202
2007/0077703 A1 * 4/2007 Lee ........................... 438/244

FOREIGN PATENT DOCUMENTS

JP     2002-64157      2/2002
KR   10-2004-0001987   1/2004

* cited by examiner

*Primary Examiner*—Calvin Lee
(74) *Attorney, Agent, or Firm*—Myers Bigel Sibley & Sajovec

(57) ABSTRACT

Semiconductor devices are provided on a substrate having a cell array region and a peripheral circuit region. A first device isolation layer defines a cell active region in the cell array region and a second device isolation layer having first and second sidewalls defines a peripheral active region in the peripheral circuit region. A cell gate pattern that includes a plurality of conductive layers crosses over the cell active region, and a peripheral gate pattern that includes a plurality of conductive layers crosses over the peripheral active region. A lowermost layer of the peripheral gate pattern has first and second sidewalls that are aligned with respective of either the first and second sidewalls of the second device isolation layer or a vertical extension of the first and second sidewalls of the second device isolation layer. Further, the lowest layer of the cell gate pattern and the lowest layer of the peripheral gate pattern comprise different conductive layers.

12 Claims, 26 Drawing Sheets

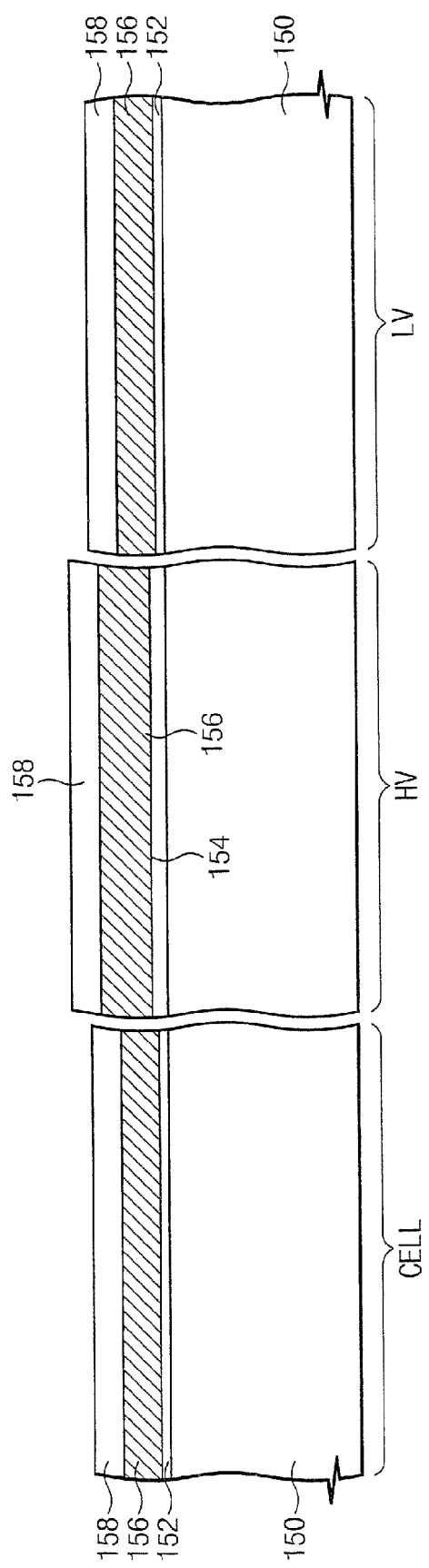

SEMICONDUCTOR DEVICES HAVING IMPROVED GATE INSULATING LAYERS AND RELATED METHODS OF FABRICATING SUCH DEVICES

CLAIM OF PRIORITY

This application claims priority under 35 U.S.C. § 120 from U.S. patent application Ser. No. 10/982,580, filed Nov. 4, 2004, which claims priority under 35 U.S.C. § 119 from Korean Patent Application No. 2004-36075, filed on May 20, 2004, the disclosures of each of which are incorporated by reference herein in there entireties.

FIELD OF THE INVENTION

The present invention generally relates to semiconductor devices and methods of forming the same and, more specifically, to semiconductor devices having multiple gate insulating layers and related methods of fabricating such devices.

BACKGROUND OF THE INVENTION

In general, the thickness of a gate insulating layer of a transistor varies based on, among other things, the operating voltage of the transistor. Thus, in certain types of semiconductor devices, different regions of the semiconductor device may require gate insulating layers having different thicknesses based upon the type of transistors (e.g., low voltage or high voltage) included in that region of the device. Typically, non-volatile memory devices such as flash memories may require a high voltage in a write or erase operation. Accordingly, the gate insulating layers of the transistors used to implement non-volatile memory devices often typically be formed to have a thickness that is capable of resisting high voltages. In contrast, flash memory devices may be written or erased by tunneling charges that propagate through the cell gate insulating layers. Accordingly, the cell transistors used in flash memory applications may have thin gate insulating layers, which are often called tunnel insulating layers.

A method of fabricating a conventional semiconductor memory having multiple gate insulating layers is disclosed in Japanese Laid-Open Publication No. 2002-64157 entitled "SEMICONDCUTOR MEMORY INTEGRATION CIRCUIT AND METHOD OF FABRICATING THE SAME." FIGS. 1-5 are cross-sectional views illustrating steps of fabricating a conventional semiconductor device having multiple gate insulating layers.

Referring to FIG. 1, a semiconductor substrate 10 is prepared. The semiconductor substrate includes a cell array region CELL, a high-voltage region HV and a low-voltage region LV. A tunnel insulating layer 21a and a first conductive layer 22a are formed on the cell array region CELL. A first gate insulating layer 21b and a second gate insulating layer 21c are formed on the high-voltage region HV and the low-voltage region LV, respectively. As tunnel insulating layers typically should provide high reliability as compared to other insulating layers, the tunnel insulating layer 21a and the first conductive layer 22a may be formed successively.

As shown in FIG. 2, a second conductive layer 22b, 22c may be formed on the first gate insulating layer 21b and on the second gate insulating layer 21c. Referring to FIG. 3, the first conductive layer 22a, the second conductive layer 22b, 22c, the first gate insulating layer 21b, the second gate insulating layer 21c and the substrate 10 may be patterned to form a trench. An insulating layer may be formed over the surface of the substrate. Chemical mechanical polishing may then be performed to form a device isolation layer 14 and to form a conductive pattern 22 from the conductive layers 22a, 22b, 22c.

Referring to FIG. 4, a third conductive layer 24 is formed over the surface of the substrate. The third conductive layer 24 may then be patterned in the cell array region CELL. The third conductive layer 24 may be isolated by the device isolation layer 14 in the cell array region CELL.

As shown in FIG. 5, a dielectric layer 26 is formed over the surface of the cell array region CELL, and a fourth conductive layer 28 is formed on the dielectric layer 26 and on the third conductive layer 24.

In the above-described fabrication process, the tunnel insulating layer and the gate insulating layer may be formed before the device isolation layer is formed. Tunnel insulating layers may require high reliability. However, when the tunnel insulating layer is formed before the device isolation layer, physical stress may be applied to the tunnel insulating layer when the insulating layer is polished via chemical mechanical polishing. Likewise, stress may be applied to an edge of the tunnel insulating layer during the trench formation and filling processes as a result of etching damage and/or pressure.

Another method of fabricating a semiconductor device having multiple gate insulating layers is disclosed in U.S. Pat. No. 6,165,846 entitled "METHOD OF ELIMINATING GATE LEAKAGE IN NITROGEN ANNEALED OXIDES." FIGS. 6-8 are cross-sectional views illustrating steps of fabricating another conventional semiconductor device having multiple gate insulating layers.

Referring to FIG. 6, a semiconductor device is prepared. The semiconductor device includes a cell array region CELL, a high-voltage region HV and a low-voltage region LV. A device isolation layer 90 is formed in the semiconductor substrate, and a buffer insulating layer 130 is formed on the surface of the substrate. A portion of the buffer insulating layer 130 is removed in the CELL region and a thin tunnel insulating layer 132 is provided.

Referring to FIGS. 7-8, a conductive pattern 140 is formed on the cell array region CELL, and a dielectric layer 180 is formed on the conductive pattern 140. Next, a first gate insulating layer 200' and a second gate insulating layer 210 are formed at the high-voltage region HV and the low-voltage region LV, respectively. A conductive layer 220 is formed on the dielectric layer 180, the first gate insulating layer 200' and the second gate insulating layer 210.

In the above-described fabrication process, the tunnel insulating layer may be formed after the device isolation layer is formed. As a result, the tunnel insulating layer may be protected from stress and/or damage caused by etching. However, after the device isolation layer is formed, insulating layers are formed and removed in the high-voltage region HV and the low-voltage region LV several times to form the first gate insulating layer and the second gate insulating layer. During the forming, removing and cleaning processes associated with the formation of these insulating layers, edges of the device isolation layer may be recessed to form a dent. As is well known in the art, such a dent may induce turn-on of a parasitic transistor resulting in a phenomena known as "hump phenomena." Specifically, during the formation of the transistor, an active region may be formed having a low ion concentration to increase the breakdown voltage of a high-voltage transistor. When a well is formed by implanting boron, or in case of NMOS transistors for controlling threshold voltage, a parasitic transistor with low threshold voltage may be formed at the dent because the ion-concentration at the interface between the active region and the device isolation layer may be reduced by separation of the boron. As a result, the hump phenomenon may deepen.

SUMMARY OF THE INVENTION

Pursuant to embodiments of the present invention, semiconductor devices may be provided that have a gate insulating layer which can provide different reliability in different regions of the device and/or which are capable of reducing or minimizing dents which may occur at the edge of the device isolation layer. Methods of forming such devices are also provided.

In embodiments of the present invention, semiconductor devices are provided which include a substrate that has a cell array region and a peripheral circuit region. A first device isolation layer defines a cell active region in the cell array region and a second device isolation layer defines a peripheral active region in the peripheral circuit region. The device includes a cell gate pattern having a plurality of conductive layers that cross over the cell active region and a peripheral gate pattern having a plurality of conductive layers that cross over the peripheral active region. A lowermost layer of the peripheral gate pattern may have first and second sidewalls that are aligned with respective of either first and second sidewalls of the second device isolation layer or a vertical extension of the first and second sidewalls of the second device isolation layer, and the lowest layer of the cell gate pattern and the lowest layer of the peripheral gate pattern may comprise different conductive layers.

The semiconductor device may further include a tunnel insulating layer between the cell active region and the cell gate pattern, where the upper surface of the edge portion of the tunnel insulating layer is lower than the upper surface of the center portion of the tunnel insulating layer. The device may also include a gate insulating layer between the peripheral active region and the peripheral gate pattern, where the upper surface of the edge portion of the gate insulating layer is higher than the upper surface of the center portion of the gate insulating layer. The cell gate pattern may overlap a portion of the first device isolation layer and the peripheral gate pattern may overlap a portion of the second device isolation layer. In such embodiments, the height of the overlapped portion of the first device isolation layer may be lower than the height of the overlapped portion of the second device isolation layer.

In the above-described embodiments of the present invention, the peripheral gate pattern may comprise a lower gate pattern and an upper gate pattern on the lower gate pattern. The lower gate pattern may have a first sidewall that is aligned with a vertical extension of the first sidewall of the second device isolation layer and a second sidewall that is aligned with a vertical extension the second sidewall of the second device isolation layer. The first and second sidewalls of the second device isolation layer may protrude above the upper surface of the peripheral active region. The first and second sidewalls of the lower gate pattern may contact the first and second sidewalls of the second device isolation layer, respectively.

In these embodiments, the cell gate pattern may include a floating gate on the cell active region, the floating gate having an edge portion that overlaps at least a portion of the first device isolation layer, an inter-gate dielectric layer on the floating gate and a control gate electrode on the inter-gate dielectric layer. The floating gate may comprise an upper floating gate stacked on a lower floating gate.

In further embodiments of the present invention, semiconductor devices are provided that include a substrate that has a cell array region and a peripheral circuit region. The devices may further include a first device isolation layer that defines a cell active region in the cell array region and a second device isolation layer that defines a peripheral active region in the peripheral circuit region. The second device isolation layer may have sidewalls that extend above the upper surface of the peripheral active region. The device further includes a cell gate pattern that includes a plurality of conductive layers that crosses over the cell active region and a peripheral gate pattern that includes a plurality of conductive layers that crosses over the peripheral active region. A first conductive layer is patterned to form the lowest layer of the cell gate pattern at the cell active region and a second conductive layer that is different than the first conductive layer is patterned to form the lowest layer of the peripheral gate pattern at the peripheral active region.

In such embodiments, the peripheral gate pattern may include a lower gate pattern that has sidewalls that contact at least part of the portion of the sidewalls of the second device isolation layer that extend above the upper surface of the peripheral active region. An upper gate pattern may also be provided on the lower gate pattern. The cell gate pattern may include a floating gate on the cell active region that has an edge portion that overlaps at least a portion of the first device isolation layer, an inter-gate dielectric layer on the floating gate and a control gate electrode on the inter-gate dielectric layer. The device may also include a tunnel insulating layer between the cell active region and the cell gate pattern, where an upper surface of an edge portion of the tunnel insulating layer is lower than an upper surface of a center portion of the tunnel insulating layer. The device may further include a gate insulating layer between the peripheral active region and the peripheral gate pattern, where an upper surface of an edge portion of the gate insulating layer is higher than an upper surface of a center portion of the gate insulating layer. Additionally, the cell gate pattern may overlap a portion of the first device isolation layer and the peripheral gate pattern may overlap a portion of the second device isolation layer. The height of the overlapped portion of the first device isolation layer may be lower than the height of the overlapped portion of the second device isolation layer.

Pursuant to still further embodiments of the invention, semiconductor devices are provided that include a substrate having a cell array region and a peripheral circuit region. A first device isolation layer defines a cell active region on the cell array region and a second device isolation layer defines a peripheral active region on the peripheral circuit region. The devices include a cell gate pattern that includes a plurality of conductive layers crossing over the cell active region. The cell gate pattern has a plurality of sidewalls that are aligned with a vertical extension of respective ones of a plurality of sidewalls of the first device isolation layer. The devices may further include a peripheral gate pattern that includes a plurality of conductive layers that cross over the peripheral active region. The peripheral gate pattern may have a plurality of sidewalls that are aligned with a vertical extension of respective of a plurality of sidewalls of the second device isolation layer. Additionally, the lowest layer of the cell gate pattern and the lowest layer of the peripheral gate pattern are different conductive layers.

Pursuant to still further embodiments of the present invention, semiconductor devices are provided which have a first device isolation layer which defines a cell active region in a substrate and a second device isolation layer which defines a peripheral active region in the substrate. A cell gate pattern that includes a plurality of conductive layers is provided on the cell active region so as to overlap at least a portion of the first device isolation layer. A peripheral gate pattern that includes a plurality of conductive layers is provided on the peripheral active region to overlap at least a portion of the second device isolation layer. In these devices, a lowermost layer of the cell gate pattern is thinner than a lowermost layer of the peripheral gate pattern, and the portion of the first isolation layer overlapped by the cell gate pattern may be lower than the portion of the second device isolation layer overlapped by the peripheral gate pattern.

Pursuant to still further embodiments of the present invention, methods for fabricating a semiconductor device are provided in which a cell active region and a peripheral active region are defined on a semiconductor substrate. A stacked pattern that includes an insulating layer, a first conductive layer and a hard mask layer are formed on both the cell active region and the peripheral active region. The stacked pattern on the cell active region and the hard mask layer on the peripheral active region are then removed, and a tunnel insulating layer and a conductive pattern are formed on the cell active region. A second conductive layer is formed on the peripheral active region, and a dielectric layer and a third conductive layer are formed on the cell array region. Finally, the second conductive layer and the stacked pattern on the peripheral active region may be patterned to form a peripheral gate pattern, and the third conductive layer, the dielectric layer and the conductive pattern may be patterned to form a cell gate pattern.

In certain of these methods, the stacked pattern may be formed by sequentially forming a first insulating layer, a first conductive layer and a hard mask layer on the substrate, then forming a first trench to define the cell active region and a second trench to define the peripheral active region, and then forming a first device isolation layer in the first trench and a second device isolation layer in the second trench. The upper surface of the first device isolation layer adjacent the cell active region may protrude higher than the substrate in the cell active region and the upper surface of the second device isolation layer adjacent the peripheral active region may protrude higher than the substrate in the peripheral active region. Additionally, the portion of the first device isolation layer that protrudes higher than the substrate in the cell active region may be recessed during the removal of the stacked pattern on the cell active region.

Pursuant to still further embodiments of the present invention, methods for fabricating a semiconductor device are provided in which an insulating layer and a first conductive layer are formed on a substrate. A first device isolation layer is formed to define a cell active region in the substrate and a second device isolation layer is formed to define a peripheral active region in the substrate. The insulating layer and the first conductive layer are then removed from the cell active region, and a a tunnel insulating layer is formed on the cell active region. A a cell gate pattern is then formed on the cell active region and a peripheral gate pattern is formed on the peripheral active region.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIGS. 18-24 are cross-sectional views illustrating steps method of fabricating semiconductor devices according to the second embodiments of the present invention.

DETAILED DESCRIPTION

Figure 1:
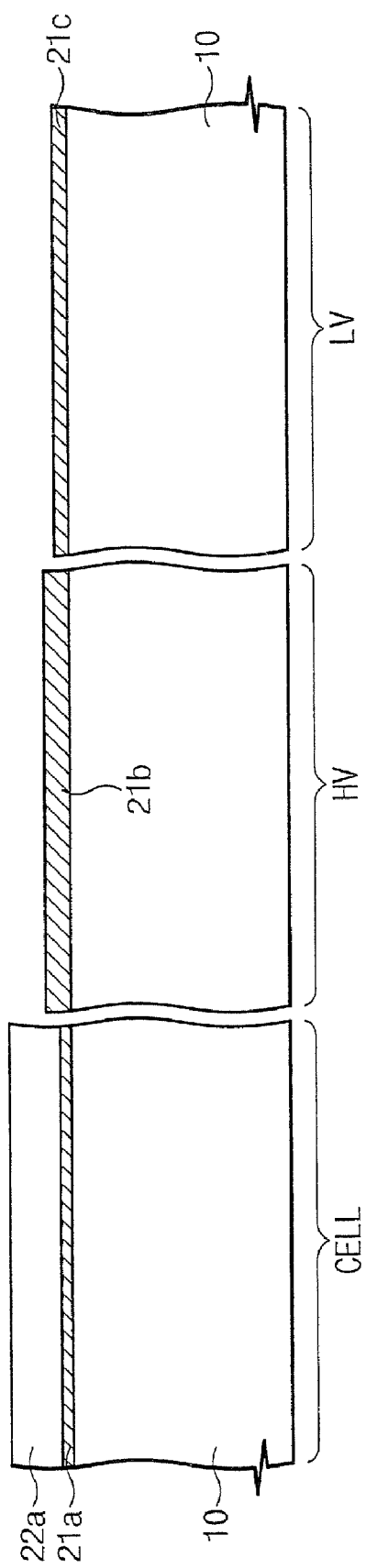
FIGS. 1-5 are cross-sectional views illustrating steps of fabricating a conventional semiconductor device having multiple gate insulating layers.
Figure 2:
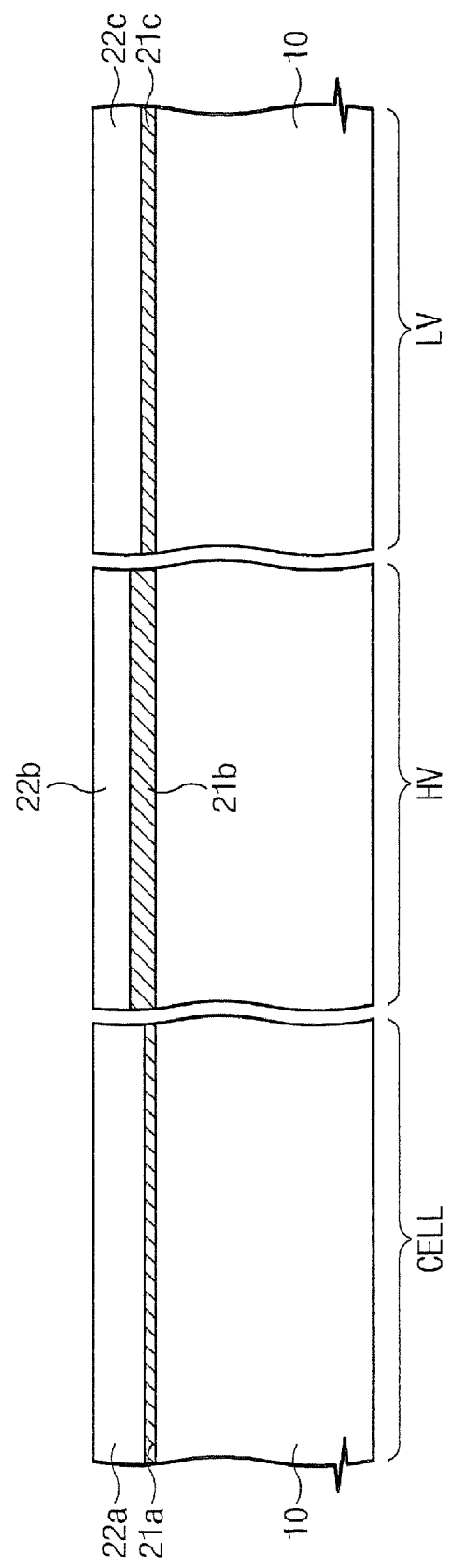
Figure 3:
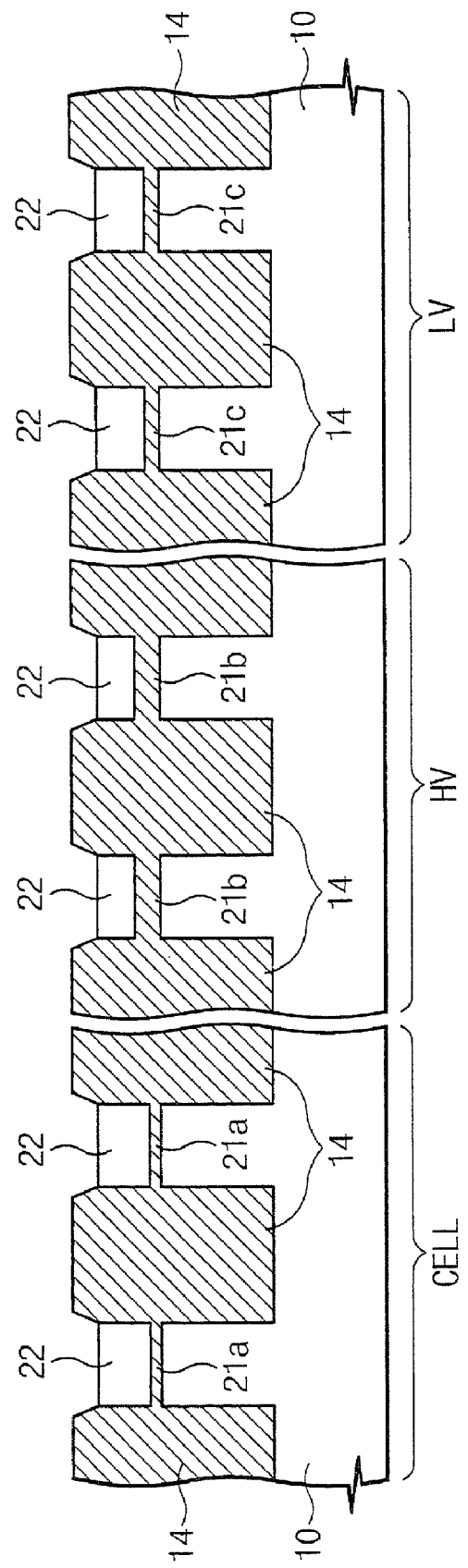
Figure 4:
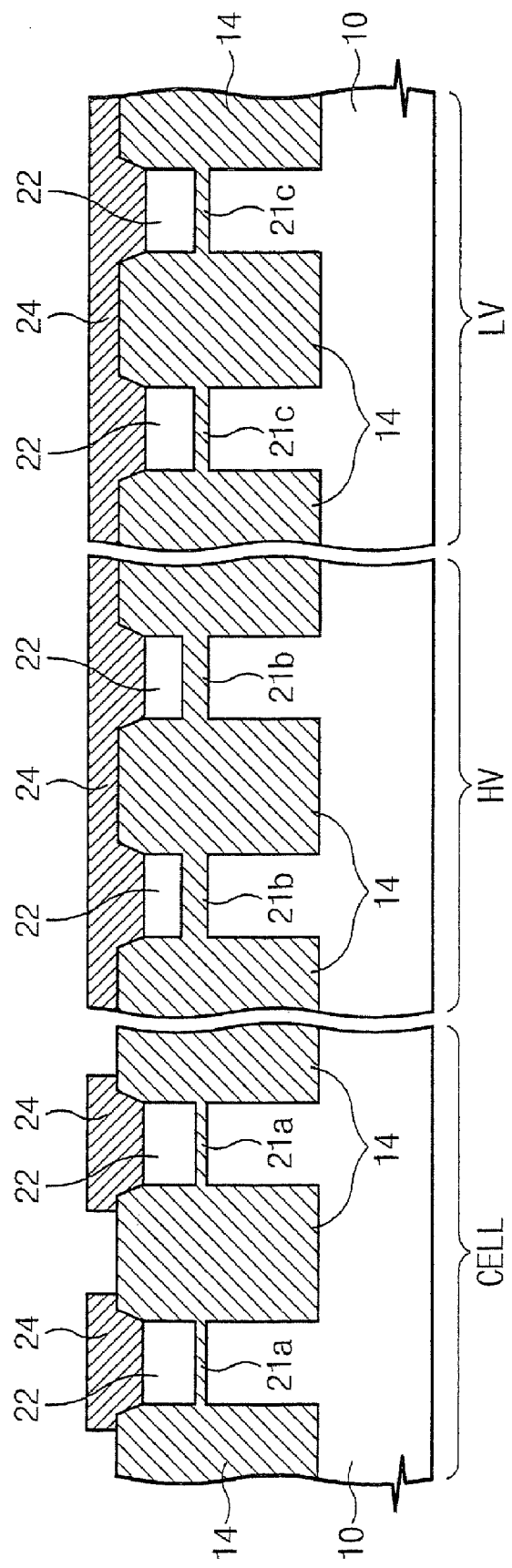
Figure 5:
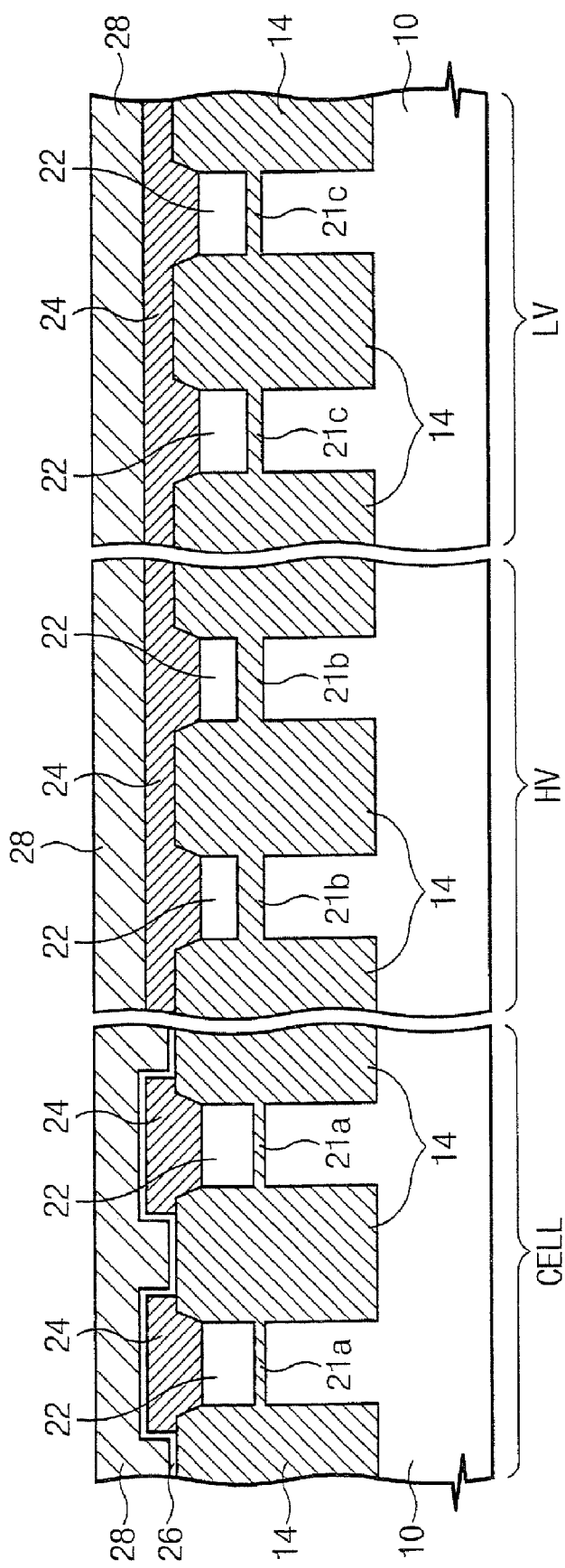
Figure 6:
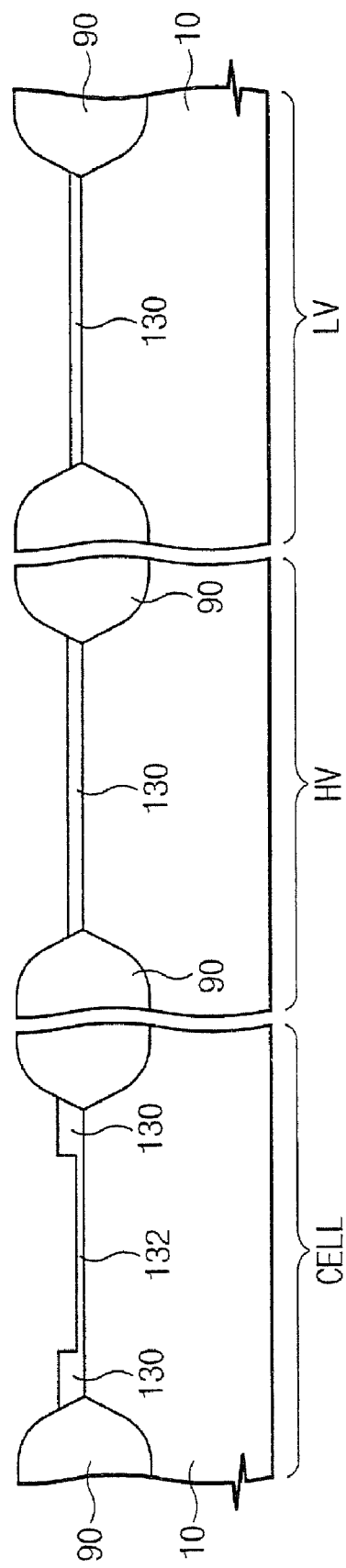
FIGS. 6-8 are cross-sectional views illustrating steps of fabricating a second conventional semiconductor device having multiple gate insulating layers.
Figure 7:
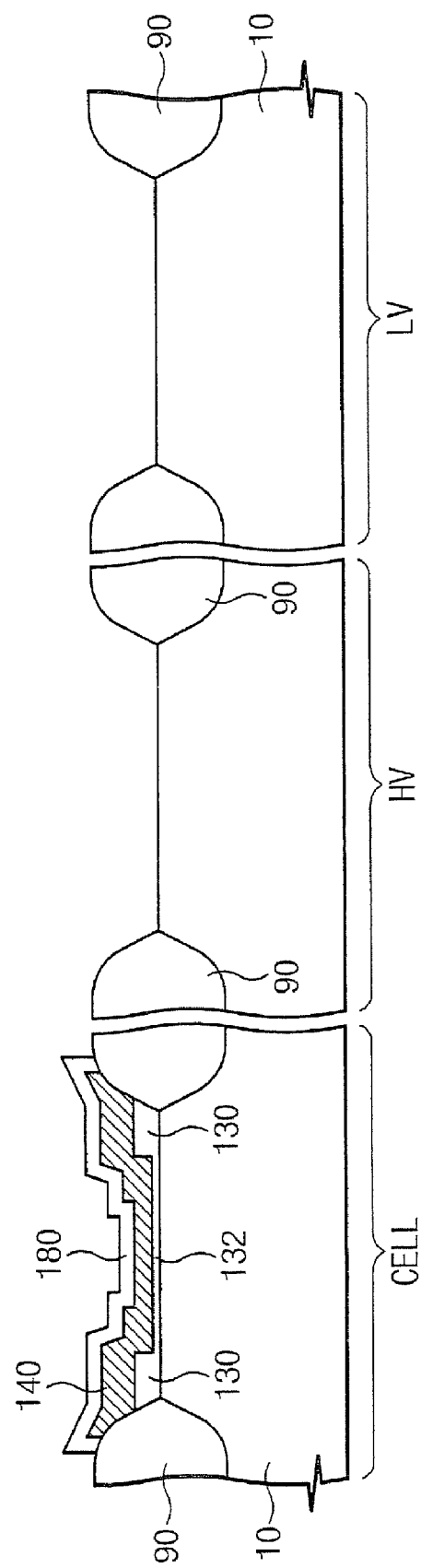
Figure 8:
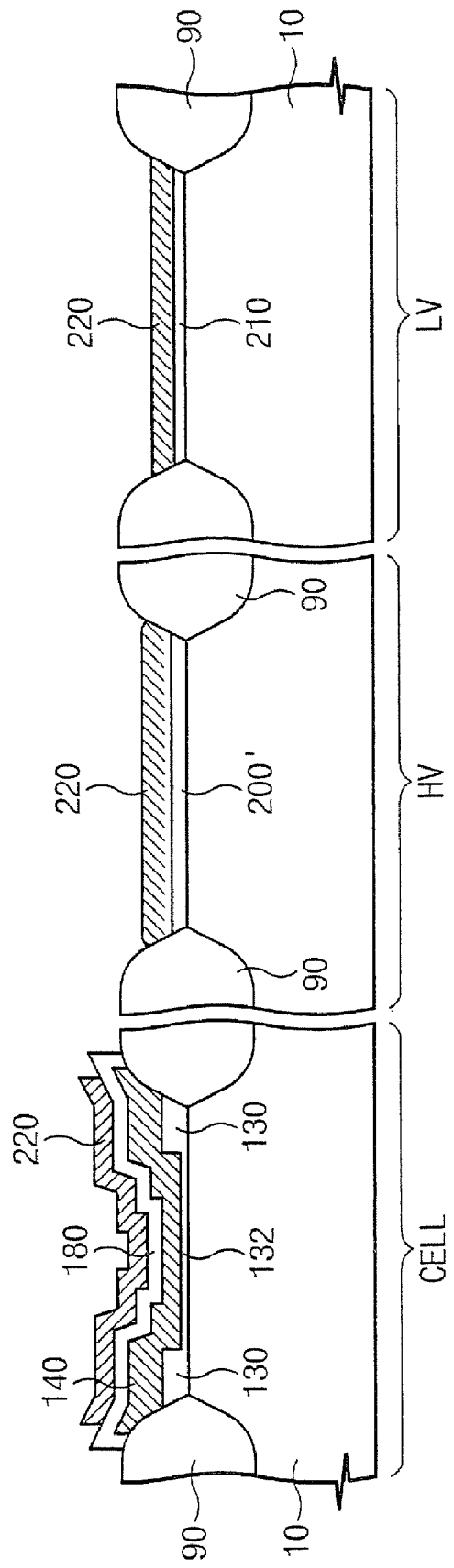

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements or layers, these elements or layers should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on", "over" or extending "onto" another element, it can be directly on/over or extend directly onto the other element or intervening elements may also be present. In contrast, when an element is referred to as being "directly on", "directly over" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will likewise be understood that when an element is referred to as being "between" two other elements, it can be directly between the two elements or intervening elements may also be included between the two elements.

Relative terms such as "below" or "above" or "upper" or "lower" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

Embodiments of the invention are described herein with reference to cross-section illustrations that depict idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are idealized in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 9A:
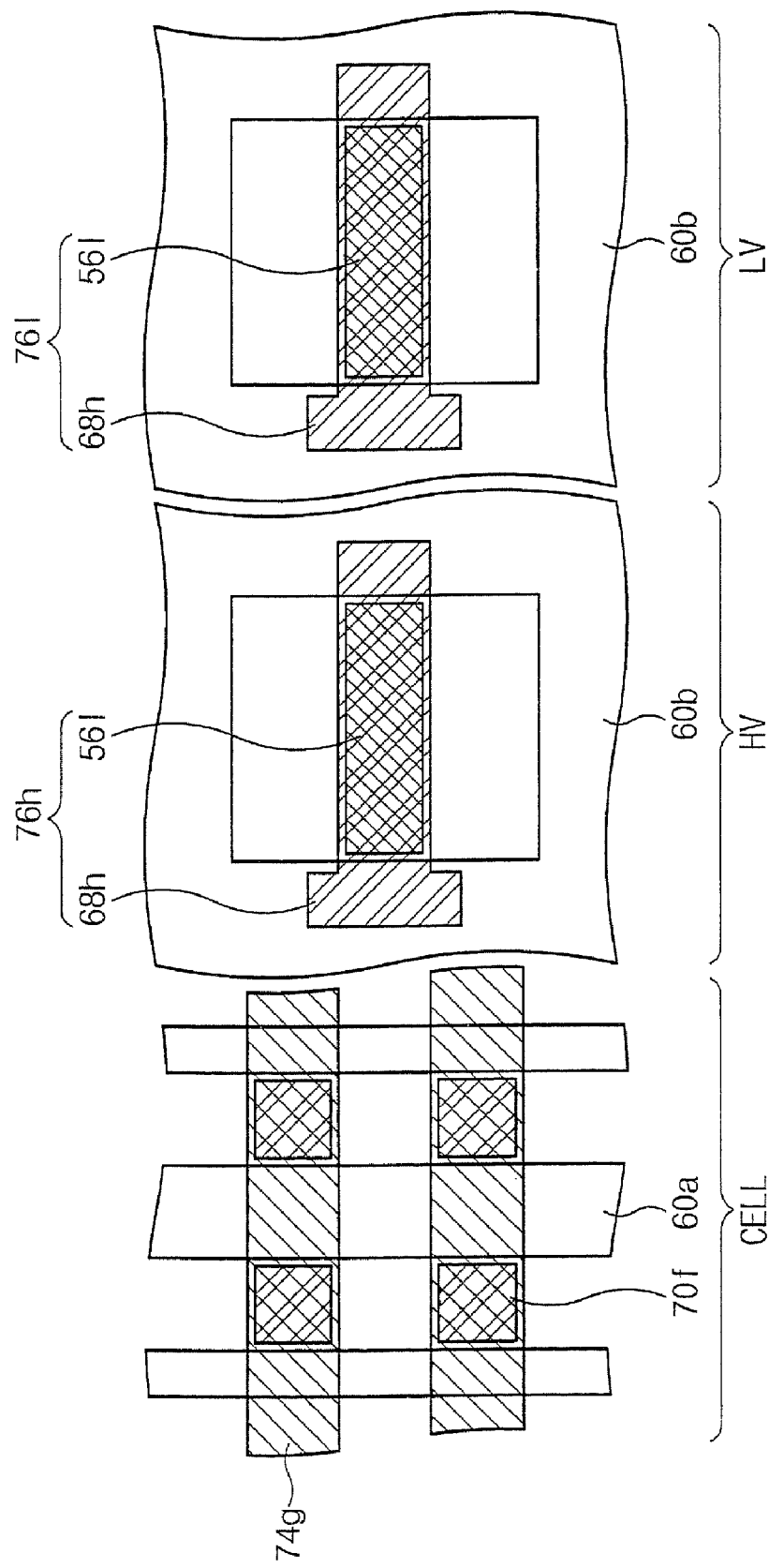
FIGS. 9A-9B are corresponding plan and cross-sectional views, respectively, illustrating semiconductor devices according to first embodiments of the present invention.
Figure 9B:
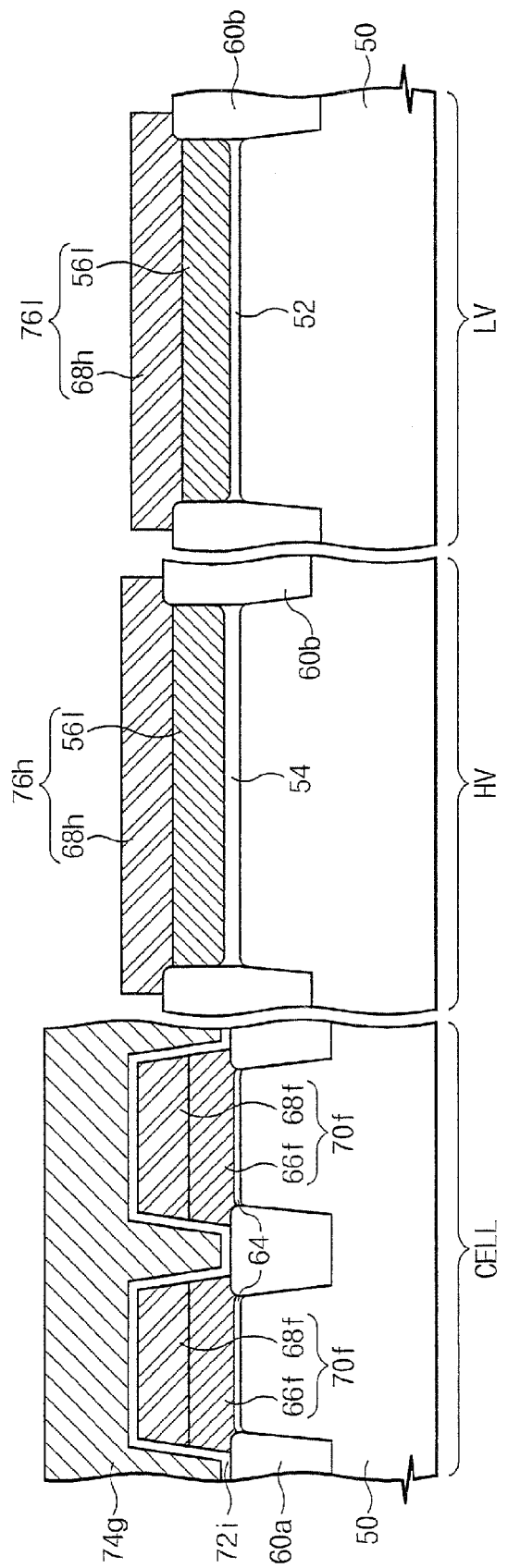

FIGS. 9A-9B are corresponding plan and cross-sectional views, respectively, illustrating semiconductor devices according to first embodiments of the present invention.

As shown in FIGS. 9A and 9B, a cell array region CELL, a high-voltage region HV and a low-voltage region LV are defined on a semiconductor substrate. In the semiconductor device of FIGS. 9A and 9B, a tunnel insulating layer 64 is formed in the cell array region CELL, whereas a thicker gate insulating layer 54 is formed in the high-voltage region HV such that the high-voltage region HV is resistant to a high operation voltage. In the the low-voltage region LV, a thinner gate insulating layer 52 is formed to facilitate higher speeds of operation.

A first device isolation layer 60a is formed in the cell array region CELL, and a second device isolation layer 60b is formed in the high and low voltage regions HV and LV, respectively. The first device isolation layer 60a defines cell active regions, and the second device isolation layer 60b defines the high and low voltage active regions, respectively. A control gate electrode 74g is formed crossing over the cell active region, and floating gate 70f are provided between the control gate electrode 74g and the cell active regions. Each floating gate 70f includes a lower floating gate 66f and an upper floating gate 68f. An inter-gate dielectric layer 72i is provided between the floating gate 70f and the control gate electrode 74g. A tunnel insulating layer 64 is provided between the lower floating gate 66f and the cell active region.

Edges of the floating gates 70f overlap the first device isolation layers 60a, so that sidewalls of the floating gates 70f are located over first device isolation layers 60a. Sidewalls of the lower floating gates 66f are self-aligned to those of the upper floating gates 68f. Edges of the cell active regions close to the first device isolation layers 60a may be recessed. In addition, the upper portion of the tunnel insulating layers 64 close to the first device isolation layer 60a may be recessed lower than the height of the center of the cell active region.

A high-voltage gate pattern 76h and a low-voltage gate pattern 76l are formed at the high-voltage active region and the low-voltage active region, respectively. The high-voltage gate pattern 76h and the low-voltage gate pattern 76l each include a lower gate pattern 56l and an upper gate pattern 68h. A high-voltage gate insulating layer 54 is formed between the high-voltage gate pattern 76h and the high-voltage active region, and a low-voltage gate insulating layer 52 is formed between the low-voltage gate pattern 76l and the low-voltage active region. The second device isolation layer 60b that is formed at the high-voltage and low-voltage regions HV and LV has sidewalls that protrude higher than the sidewalls of the first device isolation layer 60a that define the neighboring active regions. Accordingly, the lower gate pattern 56l is formed only above the active region. However, the upper gate pattern 56h may extend such that it may have a portion that overlaps a portion of a neighboring device isolation layer.

The edges of the high-voltage and low-voltage active regions may be recessed. However, upper portions of the high-voltage and low-voltage gate insulating layers are not recessed over the active regions, as the edge portions of the active regions are more oxidized than is the center portion of the active region. As a result, the upper surface of the edge portion of the gate insulating layer may be higher than the center portion of the gate insulating layer.

Figure 10:
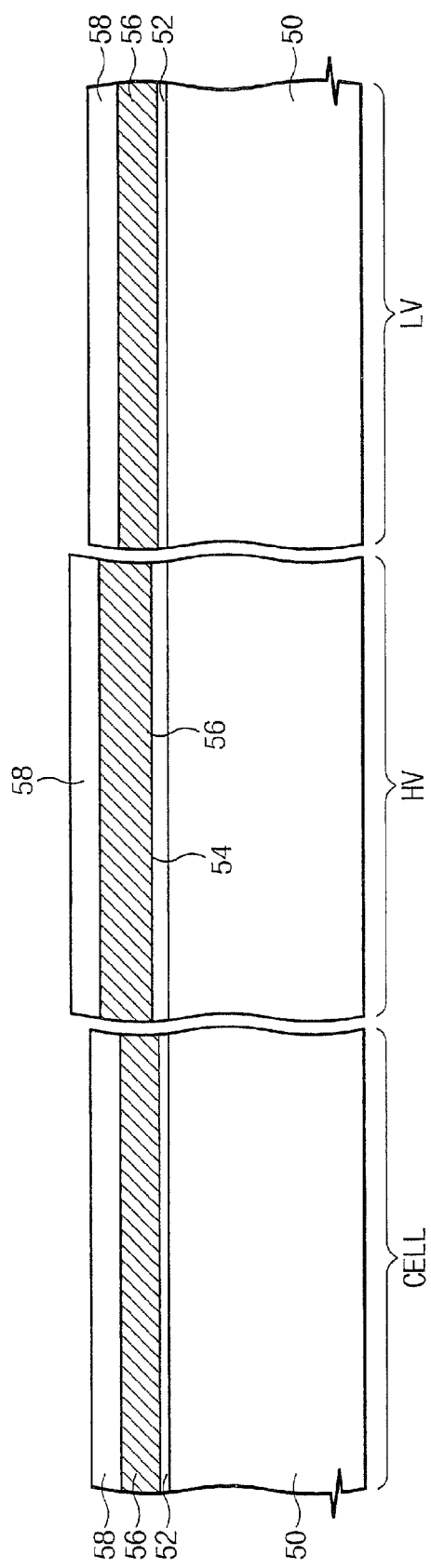
FIGS. 10-16 are cross-sectional views illustrating steps of fabricating semiconductor devices according to the first embodiments of the present invention.

FIGS. 10-16 are cross-sectional views illustrating steps of fabricating semiconductor devices according to first embodiments of the present invention. Referring to FIG. 10, a cell array region CELL, a high-voltage region HV and a low-voltage region LV are defined on a semiconductor substrate 50.

A buffer insulating layer 52, a high-voltage gate insulating layer 54 and a low-voltage gate insulating layer 52 are formed on the cell array region CELL, the high-voltage region HV and the low-voltage region LV, respectively. The buffer insulating layer 52 and the high-voltage gate insulating layer 54 may be formed at the same time. In addition, the buffer insulating layer 52 and the low-voltage gate insulating layer 52 may be formed at the same time. The buffer insulating layer 52, the high-voltage gate insulating layer 54 and the low-voltage gate insulating layer 52 may be formed using a variety of known techniques because they are formed before the device isolation layer is formed. For example, the buffer insulating layer 52, the high-voltage gate insulating layer 54 and the low-voltage gate insulating layer 52 may be formed by forming an insulating layer over the entire surface of the substrate 50, and then removing the insulating layer in the cell array region CELL and the low-voltage region LV. Then, a second insulating layer may be formed over the entire surface of the substrate again to form a thick high-voltage gate insulating layer 54 at the high-voltage region HV as well as the buffer insulating layer 52 and the low-voltage gate insulating layer 52. As another example, a high-voltage gate insulating layer and a sacrificial conductive layer may be formed on the substrate 50. The sacrificial conductive layer and the insulating layer may be removed at the cell array region and the low-voltage region, and then another insulating layer may be formed to form the low-voltage gate insulating layer 52 and the buffer insulating layer 52. A first conductive layer 56 and a hard mask layer 58 are sequentially stacked on the the buffer insulating layer 52, the high-voltage gate insulating layer 54 and the low-voltage gate insulating layer 52.

Figure 11:
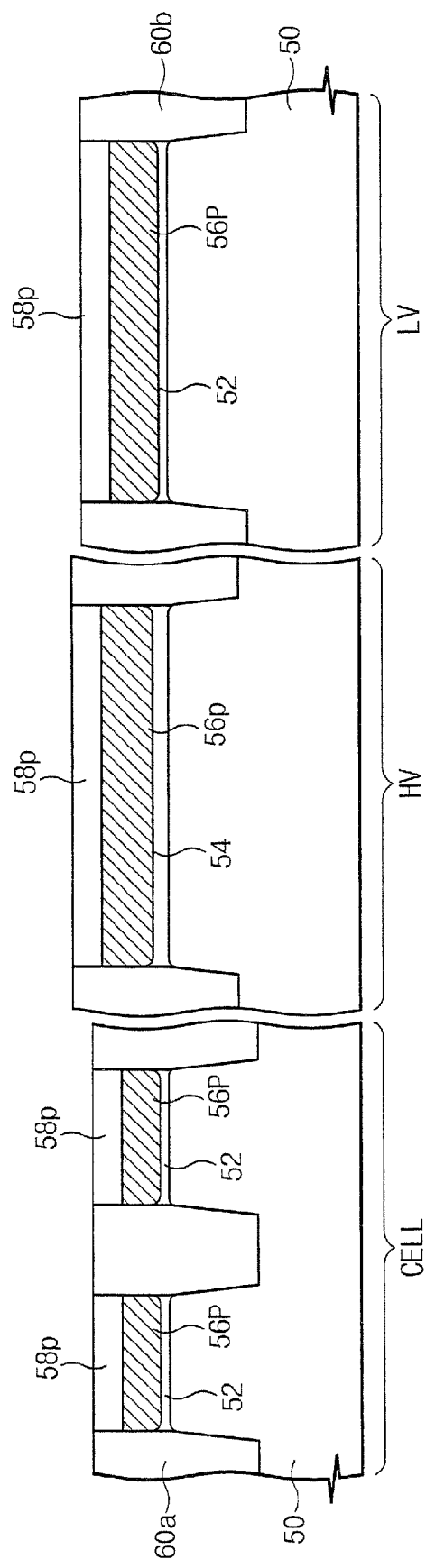

Referring to FIG. 11, a first device isolation layer 60*a* is formed at the cell array region CELL. The first device isolation layer 60*a* may be formed, for example, using a Self-Aligned Shallow Trench Isolation technology. A second device isolation layer 60*b* is formed at the high-voltage region HV and the low-voltage region LV. The first device isolation layer 60*a* defines cell active regions, and the second device isolation layer 60*b* defines a high-voltage active region(s) at the high-voltage region HV and a low-voltage active region(s) at the low-voltage region LV. Stacked patterns of an insulating layer (52 or 54), a first conductive pattern 56*p* and a hard mask pattern 58*p* are formed on the respective active regions. While the device isolation layers are formed, edge portions of the active regions may be more oxidized than are the center portions of the active regions. As a result, edge portions of the insulating layers may thicken according to the "bird's beak" phenomena.

Although not shown in FIG. 11, a channel region may be formed by implanting impurities into the substrate before the insulating layer is formed. The doping concentration of the channel in the cell array region may be relatively high, while the doping concentration of the channel in peripheral circuit regions such as the high-voltage and low-voltage regions may be relatively low.

Figure 12:
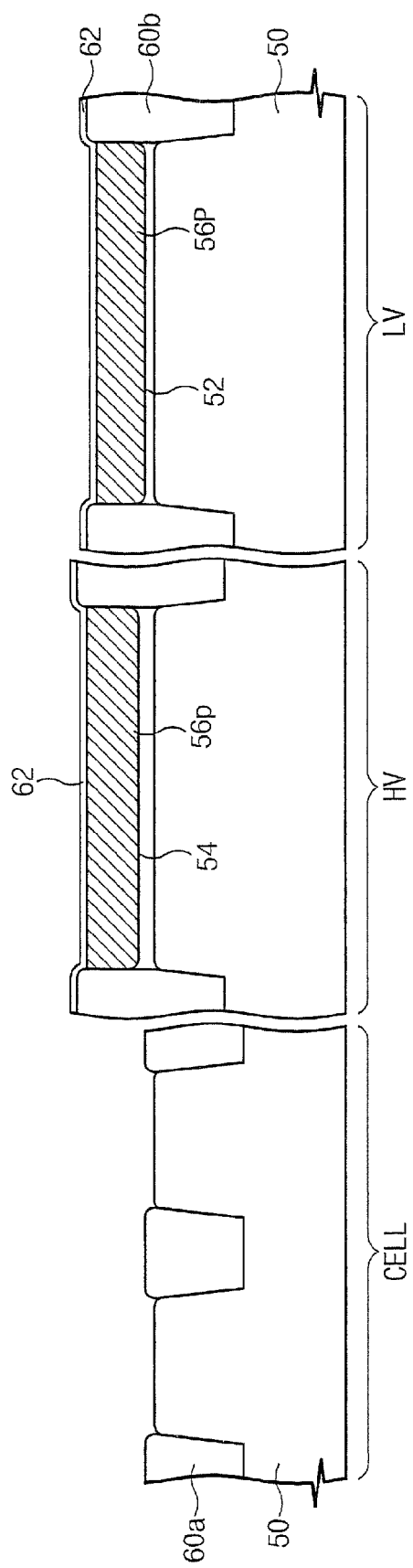

As shown in FIG. 12, the hard mask patterns 58*p* may then be removed, and an etch stop layer 62 may be formed on the substrate. The etch stop layer 62 may, for example, be a silicon nitride layer. A silicon oxide layer may also be formed on the substrate prior to the formation of the silicon nitride layer. Next, the etch stop layer 62 in the cell array region CELL may be removed to expose the first device isolation layer 60*a* and the first conductive pattern 56*p*. Then, the first device isolation layer 60*a* may be recessed, and the first conductive pattern 56*p* and the buffer insulating layer 52 may be removed, to thereby expose the cell active region. In embodiments of the present invention, the first device isolation layer 60*a* may be recessed approximately even with a surface of the cell active region. As shown in FIG. 12, edge portions of the cell active regions may have a slightly-recessed shape that results from the removal of the buffer insulating layer 52.

In embodiments of the present invention, the first conductive pattern 56*p* may be partially doped with N-type or P-type impurities.

Figure 13:
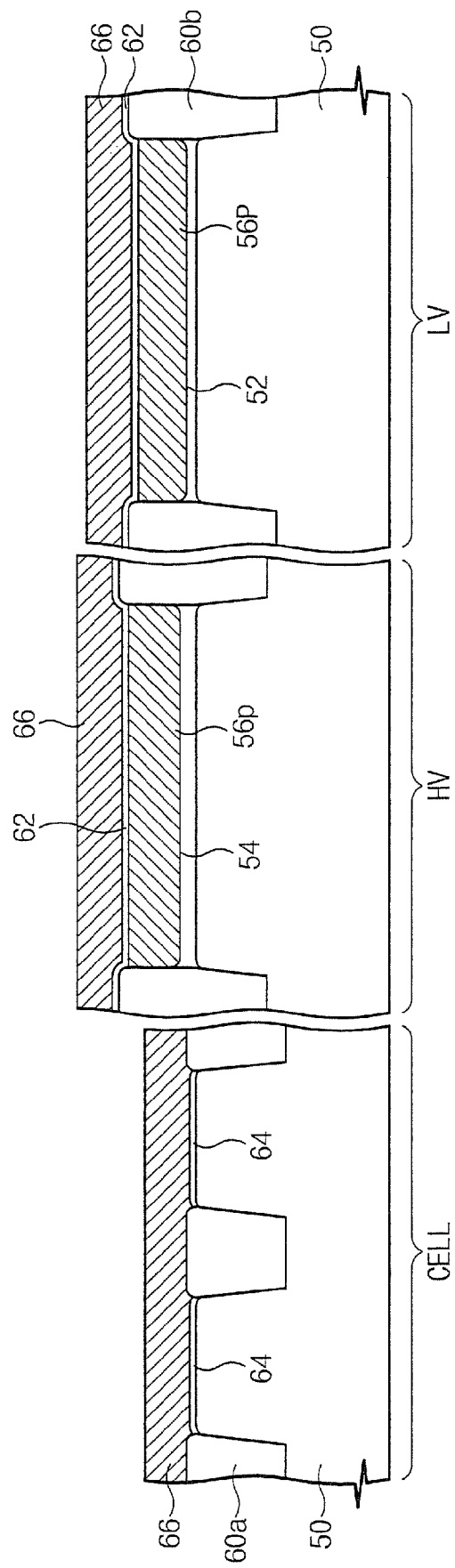

As shown in FIG. 13, a tunnel insulating layer 64 may be formed on the cell active region, and a second conductive layer 66 may be formed on the cell active region CELL, the high voltage region HV and the low voltage region LV. The tunnel insulating layer 64 may be formed so that it has an upper surface shape that matches the upper surface shape of the underlying cell active region. Accordingly, edge portions of the upper surface of the tunnel insulating layer 64 may be formed lower than the center portion of the tunnel insulating layer 64. As the tunnel insulating layer 64 is relatively thin, the bird's beak shape is hardly formed at the edge of the active region. Even if a bird's beak shape is formed, edges of the active regions may be rounded.

The second conductive layer 66 may be formed to have a different doping concentration than the first conductive pattern 56*p*. This may facilitate forming semiconductor devices with different characteristic in the cell array region and the peripheral regions.

Figure 14:
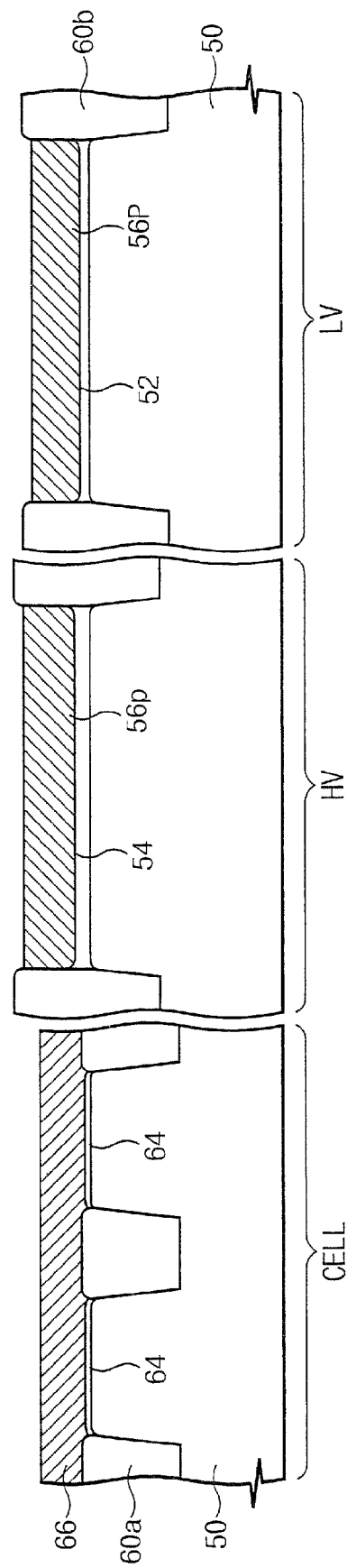

As shown in FIG. 14, the second conductive layer 66 and the etch stop layer 62 of the high-voltage region HV and the low-voltage region LV are removed.

Figure 15:
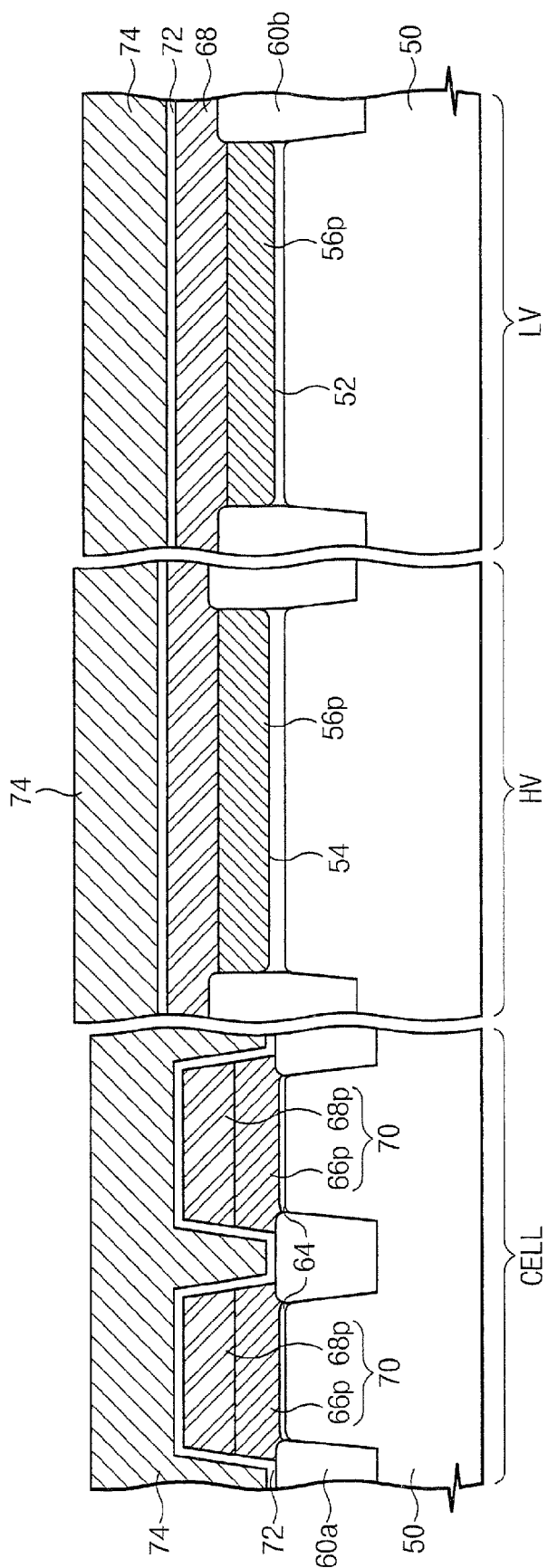

As shown in FIG. 15, a third conductive layer 68 may then be formed on the cell active region CELL, the high voltage region HV and the low voltage region LV. The third conductive layer 68 of the cell array region CELL and the second conductive layer 66 may then be sequentially patterned to form the floating gate pattern 70. The floating gate pattern 70 covers the cell active region(s), and edges of the floating gate patterns 70 overlap the first device isolation layer 60*a*. The floating gate pattern 70 includes an upper floating gate pattern 68*p* and a lower floating gate pattern 66*p*. The lower floating gate pattern 66*p* may be self-aligned to the upper floating gate pattern 68*p*. A dielectric layer 72 may then be formed on the cell active region CELL, the high voltage region HV and the low voltage region LV. A fourth conductive layer 74 may be formed on the dielectric layer.

Figure 16:
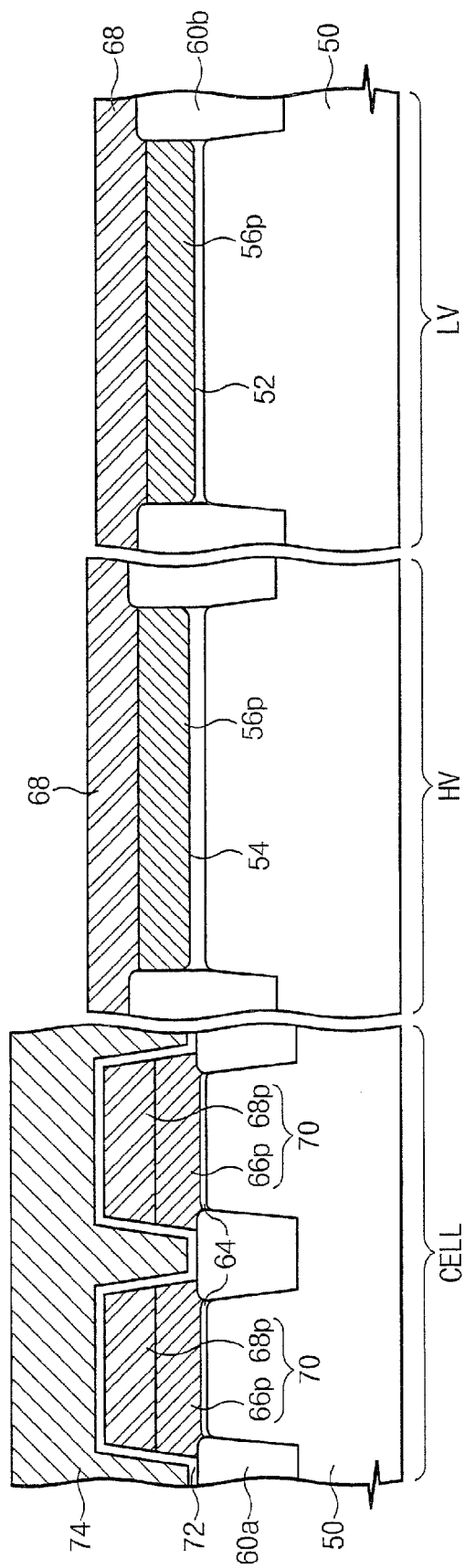

Referring to FIG. 16, the fourth conductive layer 74 and the inter-gate dielectric layer 72 of the high-voltage region HV and the low-voltage region LV are removed to expose the third conductive layer 68.

Next, the fourth conductive layer 74, the dielectric layer 72 and the floating gate pattern 70 in the cell active region CELL are sequentially patterned to form a control gate electrode(s) 74*g*, a floating gate(s) 70*f*, an inter-gate dielectric layer(s) 72*i* and a tunnel insulating layer(s) 64 (see FIG. 9B). The control gate electrode(s) 74*g* cross over the cell active regions. The floating gates 70*f* are interposed between respective control gate electrodes 74*g* and cell active regions. The inter-gate dielectric layers 72*i* are interposed between the floating gates 70*f* and the control gate electrodes 74*g*. The tunnel insulating layers 64 are interposed between the floating gate 70*f* and the cell active region.

As noted above, the gate insulating layer of transistors formed in the high-voltage and low-voltage regions are formed before the device isolation layers are formed. As a result, it may be possible to reduce or eliminate the dent that may form at edges of active regions in the peripheral circuit regions.

Figure 17A:
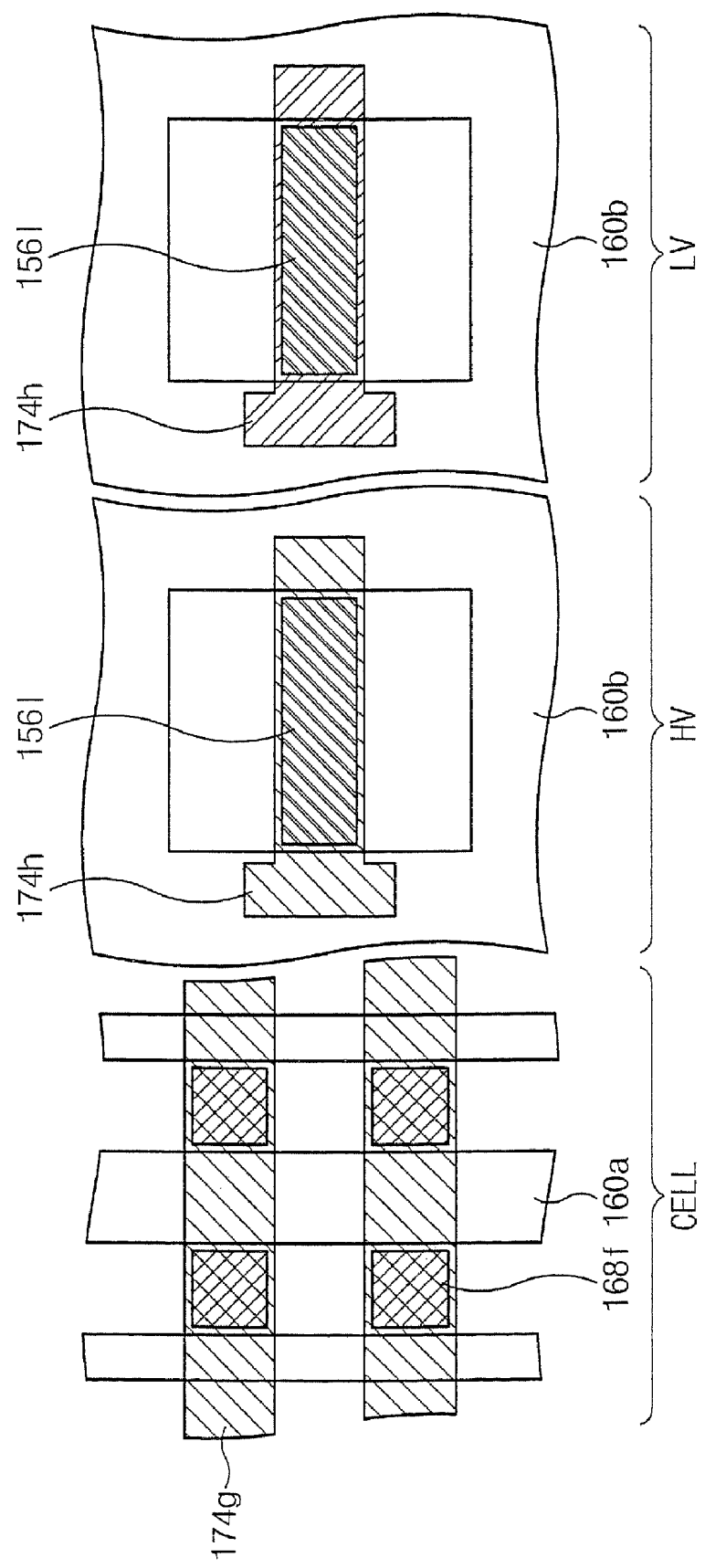
FIGS. 17A-17B are corresponding plan and cross-sectional views, respectively, illustrating semiconductor devices according to second embodiments of the present invention.
Figure 17B:
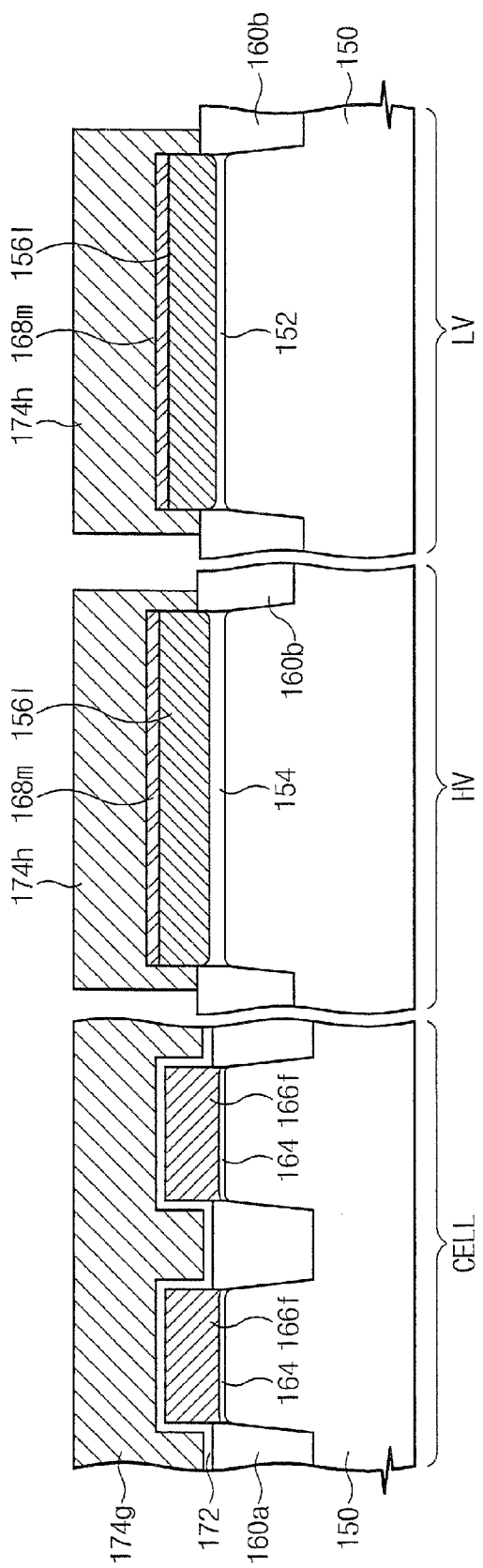

FIGS. 17A and 17B are corresponding plan and cross-sectional views, respectively, illustrating semiconductor devices according to second embodiments of the present invention.

Referring to FIGS. 17A and 17B, a cell array region CELL, a high-voltage region HV and a low-voltage region LV are defined on a semiconductor substrate. A tunnel insulating layer 164 is provided in the cell array region CELL. During device operation, charges may tunnel through the tunnel insulating layer 164. The high-voltage region HV includes a relatively thick gate insulating layer 154 that may be resistant to a high operation voltage. The low-voltage region LV includes a relatively thin gate insulating layer that facilitates fast operating speeds.

A first device isolation layer 160*a* is formed in the cell array region CELL, and a second device isolation layer 160*b* is formed in the high and low voltage regions HV and LV. The first device isolation layer 160*a* defines cell active regions, and the second device isolation layer 160*b* defines the high and low voltage active regions. A control gate electrode 174*g* is formed crossing over the cell active regions, and floating gates 166*f* are interposed between the control gate electrodes 174*g* and the cell active regions. An inter-gate dielectric layer 172*i* is interposed between the floating gates 166*f* and the control gate electrodes 174*g*. A tunnel insulating layer(s) 164 is interposed between the floating gate(s) 166*f* and the cell active region(s).

The floating gate(s) 166f may be formed only on the cell active region by, for example, forming the floating gate(s) 166f between the first device isolation layers 160a such that the sidewalls of the floating gate are aligned to an extension of sidewalls of the device isolation layer 160a. By this it is meant that the first device isolation layer 160a is recessed along the sidewalls of the floating gate 166f such that the sidewalls of the floating gate 166f are in vertical alignment with respective sidewalls of the first device isolation layer 160a as shown by the dotted line in FIG. 17B.

The edge of the cell active region that is close to the first device isolation layer 160a may be recessed. In addition, the edge portions of the upper surface of the tunnel insulating layer 164 that are close to the first device isolation layer may be recessed so that they are lower than the height of the central portion of the upper surface of the tunnel insulating layer 164.

A high-voltage gate pattern and a low-voltage gate pattern are formed on the high-voltage active region and the low-voltage active region. The high-voltage gate pattern and the low-voltage gate pattern each include a sequentially stacked structure that includes a lower gate pattern 156l, an intermediate pattern 168m and an upper gate pattern 174h. A high-voltage gate insulating layer 154 is interposed between the high-voltage gate pattern and the high-voltage active region. A low-voltage gate insulating layer 152 is interposed between the low-voltage gate pattern and the low-voltage active region. The lower gate patterns 156l may be only formed on the active region by, for example, aligning the sidewalls of the lower gate patterns 156l with a vertical extension of the sidewalls of the second device isolation layer 160b. Also, the second device isolation layer 160b is recessed along sidewalls of the lower gate pattern 156l. However, the upper gate pattern 174h may extend to overlap a portion of the neighboring device isolation layer.

The edge of the high-voltage active region and the low-voltage active region may be recessed. However, the upper surfaces of the high-voltage gate insulating layer 154 and the low-voltage gate insulating layer 152 are not recessed. On the contrary, such upper surfaces of the edge portions of the high-voltage gate insulating layer 154 and the low-voltage gate insulating layer 152 may be higher than the center portions of the respective high-voltage gate insulating layer 154 and the low-voltage gate insulating layer 152.

FIGS. 18-24 are cross-sectional views illustrating steps of fabricating semiconductor devices according to the second embodiments of the present invention.

Referring to FIG. 18, a cell array region CELL, a high-voltage region HV and a low-voltage region LV are defined on a semiconductor substrate 150. A buffer insulating layer 152 is formed on the cell array region CELL. A high-voltage gate insulating layer 154 is formed on the high-voltage region HV. A low-voltage gate insulating layer 152 is formed on the low-voltage region LV. In addition, a first conductive layer 156 is formed on the insulating layers 152, 154. A hard mask layer 158 is formed on the first conductive layer 156. As described above with respect to the first embodiment, impurities may be implanted into the substrate 150 to form a channel diffusion layer.

Figure 19:
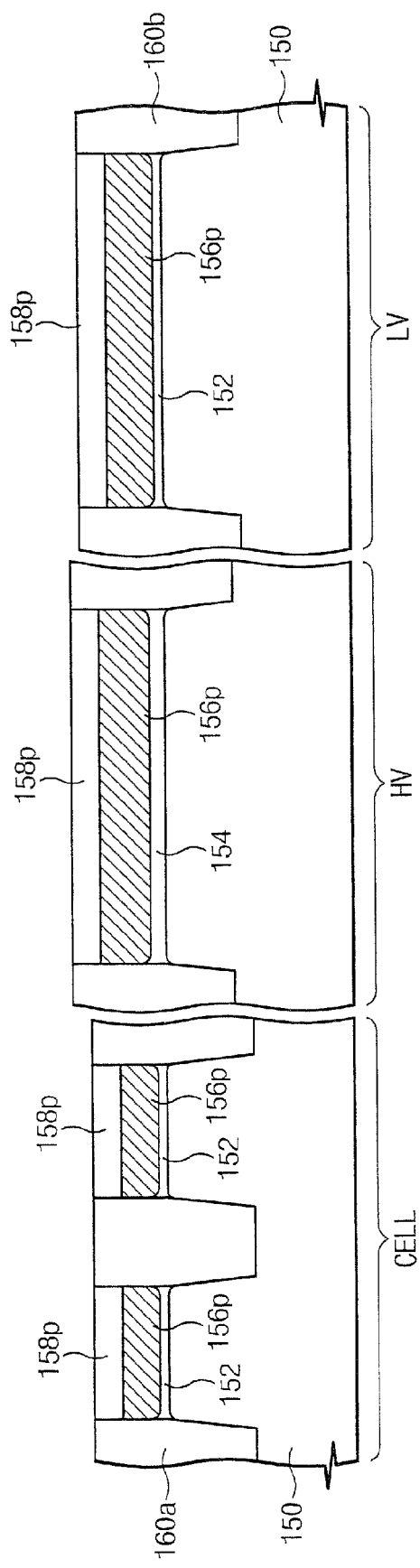

As shown in FIG. 19, a first device isolation layer 160a is formed in the cell array region CELL using, for example, a Self-Aligned Shallow Trench Isolation technology. A second device isolation layer 160b is formed in the high-voltage region HV and the low-voltage region LV. The first device isolation layer 160a defines a cell active region, and the second device isolation layer forms a high-voltage active region and a low-voltage active region. A stacked pattern may then be formed on each of the respective active regions. The stacked pattern may comprise a sequentially stacked structure that includes a first conductive pattern 156p and a hard mask pattern 158p.

Figure 20:
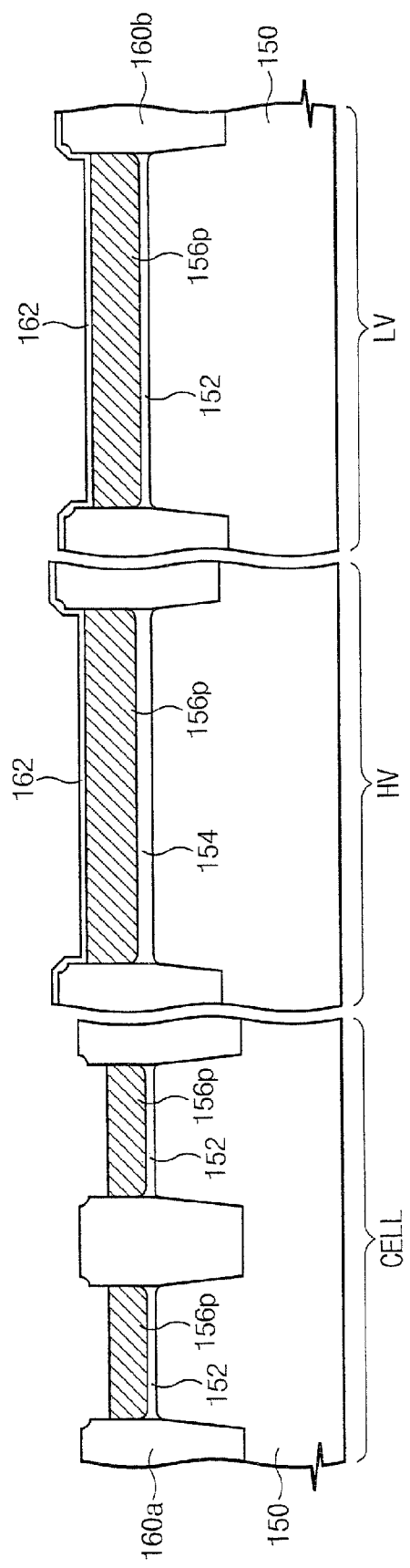

Referring to FIG. 20, the hard mask pattern 158p is removed to expose the first conductive pattern 156p. The first conductive pattern 156p may be doped with different conductivity types in the different regions. Next, an etch stop layer 162 may be formed on the cell array region CELL, the high-voltage region HV and the low-voltage region LV. The etch stop layer 162 on the cell array region CELL may then be removed. The etch stop layer 162 may be formed of a silicon nitride layer. Before forming the silicon nitride layer, a silicon oxide layer may also be formed.

Figure 21:
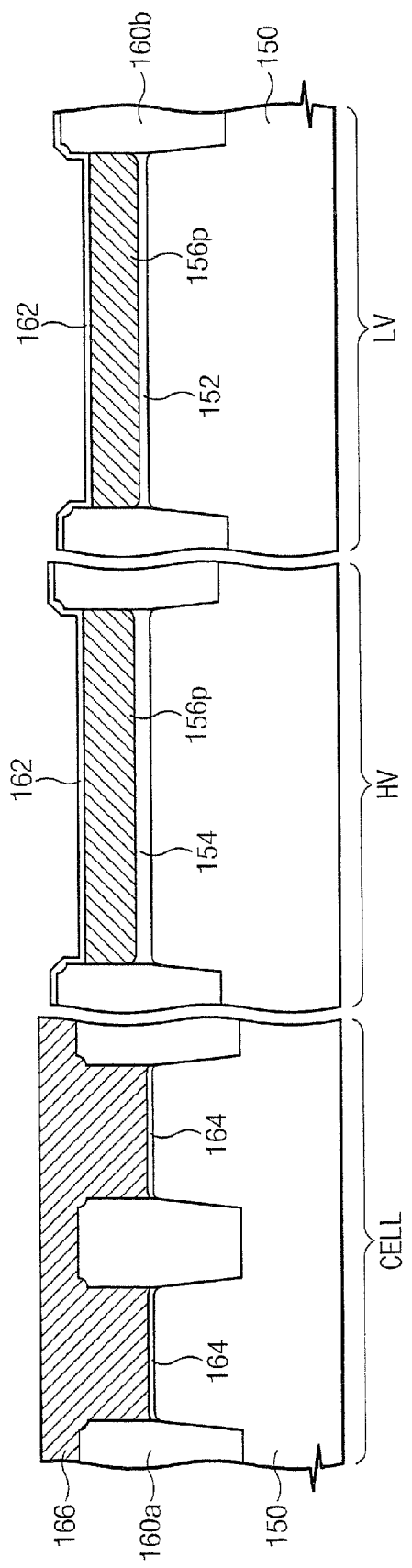

As shown in FIG. 21, the first conductive pattern 156p and the buffer oxide layer 152 on the cell array region CELL may be removed. Next, a tunnel insulating layer 164 may be formed on the cell active region, and a second conductive layer 166 may be formed on the cell array region CELL, the high-voltage region HV and the low-voltage region LV. The second conductive layer 166 may be formed of different materials or different doping-concentration from the first conductive layer. The second conductive layer 166 of the high-voltage region HV and the low-voltage region LV may then be removed to expose the etch stop layer 162.

Figure 22:
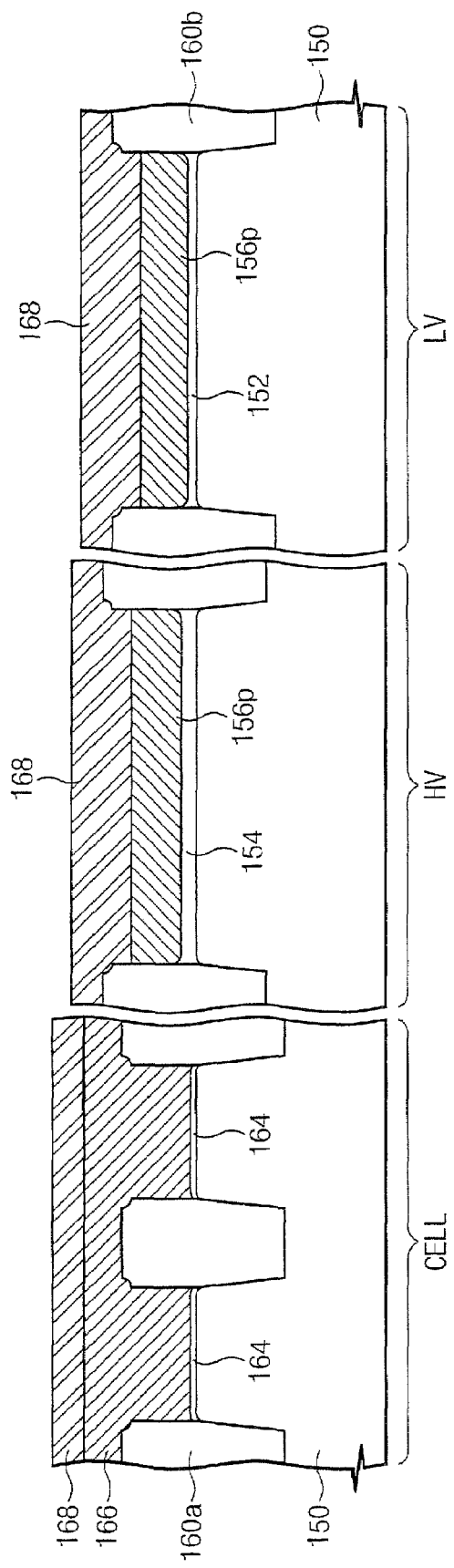

As shown in FIG. 22, the etch stop layer 162 may then be removed, and a third conductive layer 168 may be formed on the cell array region CELL, the high-voltage region HV and the low-voltage region LV.

Figure 23:
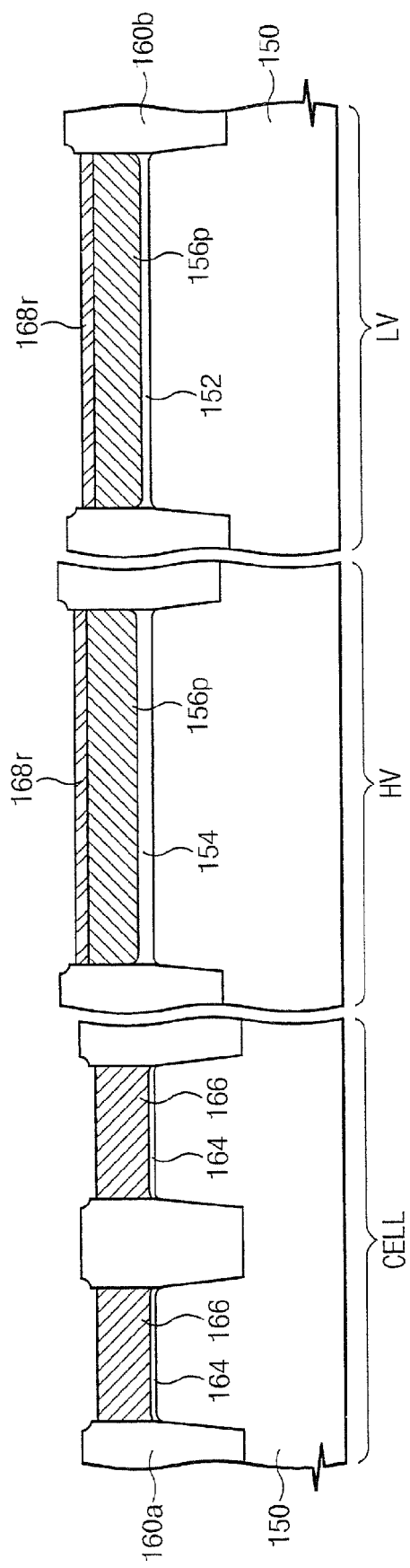

As shown in FIG. 23, the second and third conductive layers 166 and 168 are polished using a chemical mechanical polishing method until the first device isolation layer 160a and the second device isolation layer 160b are exposed. The third conductive layer 168 may act as a sacrificial conductive layer in the chemical mechanical polishing process. As shown in FIG. 23, a third conductive pattern 168r may be formed due to a residual third conductive layer 168 on the first conductive patterns 156p of the high-voltage active region and the low-voltage active region.

Figure 24:
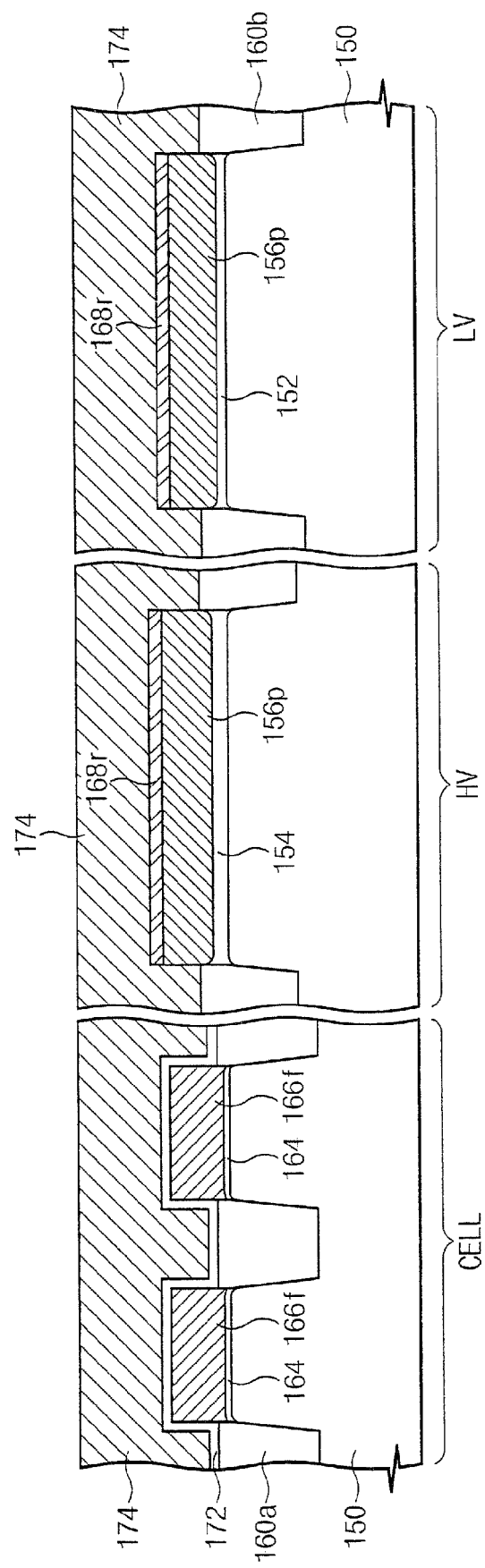

Referring to FIG. 24, the first device isolation layer 160a and the second device isolation layer 160b may then be recessed to expose sidewalls of the floating gate pattern 166f and the first conductive pattern 156p. Next, a dielectric layer 172 may be formed on the cell array region CELL, the high-voltage region HV and the low-voltage region LV, and the dielectric layer 172 may then be removed from the high-voltage and low voltage regions HV and LV.

Thereafter, the fourth conductive layer 174, the dielectric layer 172 and the floating gate pattern 166f of the cell array region may be sequentially patterned to form a control gate electrode 174g, a floating gate 166f, an inter-gate dielectric layer 172i and a tunnel insulating layer 164 (see FIG. 17B). The control gate electrode 174g crosses over the cell active region. The floating gate 166f is interposed between the control gate electrode 174g and the cell active region. The inter-gate dielectric layer 172i is interposed between the floating gate 166f and the control gate electrode 174g. The tunnel insulating layer 164 is interposed between the floating gate 166f and the cell active region. In addition, the fourth conductive layer 174 of the high-voltage region HV and the low-voltage region LV, the third conductive pattern 168r and the first conductive pattern 174h may be sequentially patterned to form the lower gate pattern 156l, the upper gate pattern 174h and an intermediate gate pattern 168m. The intermediate gate pattern 168m is formed on the lower gate pattern 156l to be interposed between the upper gate pattern 174h and the lower gate pattern 156l.

As previously mentioned, the gate insulating layer in certain regions of the device may be formed before forming the device isolation layers, while the gate insulation layer in another region of the device is formed after the device isolation layers are formed. Accordingly, a high-quality gate insulating layer can be formed in a region that requires a high reliability gate insulating layer, and a dent can be reduced in a region in which a mis-operation of a transistor is possible.

In particular, a tunnel insulating layer of a cell transistor may require relatively high reliability for information storage efficiency, and a high-voltage NMOS transistor may need to suppress the hump phenomenon which may result from a dent in the field of a flash memory device. According to embodiments of the present invention, a device satisfying one or both of these two requests may be formed.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method for fabricating a semiconductor device, the method comprising:
    defining a cell active region and a peripheral active region on a semiconductor substrate;
    forming a stacked pattern that includes an insulating layer, a first conductive layer and a hard mask layer on both the cell active region and the peripheral active region;
    removing the stacked pattern on the cell active region and the hard mask layer on the peripheral active region;
    forming a tunnel insulating layer and a conductive pattern on the cell active region;
    forming a second conductive layer on the first conductive layer of the peripheral active region;
    forming a dielectric layer and a third conductive layer on the cell active region; and
    patterning the second conductive layer and the stacked pattern on the peripheral active region to form a peripheral gate pattern, and patterning the third conductive layer, the dielectric layer and the conductive pattern to form a cell gate pattern.

2. The method of claim 1, wherein forming the stacked pattern comprises:
    sequentially forming a first insulating layer, a first conductive layer and a hard mask layer on the substrate;
    forming a first trench to define the cell active region and a second trench to define the peripheral active region; and
    forming a first device isolation layer in the first trench and a second device isolation layer in the second trench, wherein the upper surface of the first device isolation layer adjacent the cell active region protrudes higher than the substrate in the cell active region and the upper surface of the second device isolation layer adjacent the peripheral active region protrudes higher than the substrate in the peripheral active region.

3. The method of claim 2, wherein the portion of the first device isolation layer that protrudes higher than the substrate in the cell active region is recessed during the removal of the stacked pattern on the cell active region.

4. The method of claim 3, wherein forming the conductive pattern and the second conductive layer comprises the steps of:
    forming a fourth conductive layer on the cell array region;
    forming a second conductive layer on the substrate; and
    patterning the second and fourth conductive layers of the cell array region to form a conductive pattern covering the cell active region.

5. The method of claim 2, wherein forming the conductive pattern comprises the steps of:
    forming a fourth conductive layer on the cell array region; and
    forming a conductive pattern recessing the fourth conductive layer to cover the cell active region, wherein sidewalls of the conductive pattern are in contact with respective first and second sidewalls of the protruded portion of the first device isolation layer.

6. The method of claim 1, wherein the tunnel insulating layer is directly on the semiconductor substrate.

7. A method for fabricating a semiconductor device, the method comprising:
    forming an insulating layer and a first conductive layer on a semiconductor substrate;
    forming a first device isolation layer to define a cell active region in the semiconductor substrate;
    forming a second device isolation layer to define a peripheral active region in the semiconductor substrate;
    removing the insulating layer and the first conductive layer on the cell active region to expose the semiconductor substrate in the cell active region;
    forming a tunnel insulating layer directly on the semiconductor substrate in the cell active region that is exposed by the removing of the insulating layer;
    forming a cell gate pattern on the cell active region; and
    forming a peripheral gate pattern on the peripheral active region.

8. The method of claim 7, wherein the tunnel insulating layer is formed so that an tipper surface of an edge portion of the tunnel insulating layer is lower than an upper surface of a center portion of the tunnel insulating layer.

9. The method of claim 7, wherein the insulating layer on the peripheral active region is formed so that an upper surface of an edge portion of the insulating layer on the peripheral active region is higher than an upper surface of a center portion of the insulating layer on the peripheral active region.

10. The method of claim 7, wherein the first conductive layer comprises a portion of the peripheral gate pattern.

11. A method for fabricating a semiconductor device, the method comprising:
    forming an insulating layer and a first conductive layer on a cell region and a peripheral region of a substrate, wherein the insulating layer is thicker in at least a portion of the peripheral region than is the insulating layer in the cell region;
    forming a first device isolation layer to define a cell active region in the cell region of the substrate;
    forming a second device isolation layer to define a peripheral active region in the peripheral region semiconductor substrate;
    removing the insulating layer and the first conductive layer on the cell region;
    forming a tunnel insulating layer directly on the substrate of the cell region;
    forming a cell gate pattern on the tunnel insulating layer on the cell active region; and
    forming a peripheral gate pattern on the insulating layer on the peripheral active region.

12. The method of claim 11, wherein the tunnel insulating layer is formed so that an upper surface of an edge portion of the tunnel insulating layer is lower than an upper surface of a center portion of the tunnel insulating layer, and wherein the insulating layer on the peripheral active region is formed so that an upper surface of an edge portion of the insulating layer on the peripheral active region is higher than an upper surface of a center portion of the insulating layer on the peripheral active region.

* * * * *

UNITED STATES PATENT AND TRADEMARK OFFICE
CERTIFICATE OF CORRECTION

PATENT NO. : 7,452,779 B2  Page 1 of 1
APPLICATION NO. : 11/560902
DATED : November 18, 2008
INVENTOR(S) : Lee It is certified that error appears in the above-identified patent and that said Letters Patent is hereby corrected as shown below:

In the Claims:

Column 14, Claim 8, Line 26: Please correct "that an tipper surface"
To read -- that an upper surface --

Signed and Sealed this

Seventeenth Day of February, 2009

JOHN DOLL
*Acting Director of the United States Patent and Trademark Office*